(12) United States Patent
Ahn

(10) Patent No.: US 9,801,290 B2
(45) Date of Patent: Oct. 24, 2017

(54) FOLDABLE DISPLAY

(71) Applicant: Samsung Display Co., Ltd., Yongin, Gyeonggi-do (KR)

(72) Inventor: Sungsang Ahn, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 3 days.

(21) Appl. No.: 14/792,310

(22) Filed: Jul. 6, 2015

(65) Prior Publication Data

US 2016/0205792 A1   Jul. 14, 2016

(30) Foreign Application Priority Data

Jan. 14, 2015 (KR) .................. 10-2015-0006987

(51) Int. Cl.
| | |
|---|---|
| *G06F 1/16* | (2006.01) |
| *H05K 5/00* | (2006.01) |
| *H05K 5/02* | (2006.01) |
| *G09F 9/30* | (2006.01) |

(52) U.S. Cl.
CPC ......... *H05K 5/0017* (2013.01); *G06F 1/1652* (2013.01); *G09F 9/301* (2013.01); *H05K 5/0217* (2013.01); *H05K 5/0226* (2013.01)

(58) Field of Classification Search
None
See application file for complete search history.

(56) References Cited

U.S. PATENT DOCUMENTS

| | | | | |
|---|---|---|---|---|
| 3,228,133 | A * | 1/1966 | Baermann | G09F 7/04 248/467 |
| 3,553,873 | A * | 1/1971 | Weston | A47G 1/06 40/711 |
| 3,755,938 | A * | 9/1973 | Bytwork | G09F 23/14 40/530 |
| 3,928,921 | A * | 12/1975 | Gurman | G09B 1/08 40/621 |
| 4,242,823 | A * | 1/1981 | Bruno | G09F 7/04 40/124 |
| 4,584,223 | A * | 4/1986 | Krapf | G09B 29/002 428/192 |

(Continued)

FOREIGN PATENT DOCUMENTS

| | | |
|---|---|---|
| JP | 2013-50547 A | 3/2013 |
| KR | 10-2011-0100936 A | 9/2011 |

(Continued)

*Primary Examiner* — Courtney Smith
*Assistant Examiner* — Rashen E Morrison
(74) *Attorney, Agent, or Firm* — Knobbe, Martens, Olson & Bear, LLP

(57) ABSTRACT

A foldable display is disclosed. In one aspect, the foldable display includes a housing comprising first and second supports and a hinge connecting the first and second supports to each other. The foldable display also includes a flexible display module connected to the first and second supports. The hinge includes a first body including a rotation portion and first and second axles engaged with the rotation portion. The hinge further includes a second body including a connection portion. First and second guide lines are defined in the connection portion and are respectively engaged with the first and second axles. The second guide line has a curved shape.

25 Claims, 16 Drawing Sheets

(56) References Cited

U.S. PATENT DOCUMENTS

| | | | | |
|---|---|---|---|---|
| 5,965,848 A * | 10/1999 | Altschul | | H05K 1/189 174/254 |
| 6,889,458 B2 * | 5/2005 | Copley | | A47G 1/0616 40/600 |
| 8,355,755 B2 * | 1/2013 | Kim | | G06F 1/1616 455/425 |
| 8,369,075 B2 * | 2/2013 | Huang | | G09F 9/33 248/297.21 |
| 8,590,232 B2 * | 11/2013 | Roche | | B32B 3/06 24/303 |
| 8,698,737 B2 * | 4/2014 | Jokinen | | H05K 1/189 345/156 |
| 8,971,031 B2 * | 3/2015 | Mok | | G06F 1/1652 349/58 |
| 8,971,034 B2 * | 3/2015 | Verschoor | | G06F 1/1652 361/679.21 |
| 9,013,864 B2 * | 4/2015 | Griffin | | H04M 1/0216 16/382 |
| 9,064,431 B2 * | 6/2015 | Ahn | | G09F 9/33 |
| 9,173,288 B1 * | 10/2015 | Kim | | G06F 1/1633 |
| 9,179,559 B1 * | 11/2015 | Kim | | G06F 1/1616 |
| 9,204,565 B1 * | 12/2015 | Lee | | E05D 7/00 |
| 9,250,733 B2 * | 2/2016 | Lee | | H04M 1/02 |
| 9,348,450 B1 * | 5/2016 | Kim | | G06F 1/1681 |
| 9,395,070 B2 * | 7/2016 | Endo | | H01L 27/323 |
| 2004/0164950 A1 * | 8/2004 | Cabrera | | G02B 26/004 345/107 |
| 2005/0193610 A1 * | 9/2005 | Rost | | G09F 7/12 40/654.01 |
| 2006/0061541 A1 * | 3/2006 | Ou | | G06F 1/1615 345/107 |
| 2006/0146488 A1 * | 7/2006 | Kimmel | | G06F 1/1616 361/679.04 |
| 2008/0303782 A1 * | 12/2008 | Grant | | G06F 1/1615 345/156 |
| 2010/0038023 A1 * | 2/2010 | Kho | | B32B 17/06 156/247 |
| 2010/0075717 A1 * | 3/2010 | Ou | | G06F 1/1616 455/566 |
| 2010/0182518 A1 * | 7/2010 | Kirmse | | G06F 1/1626 348/836 |
| 2010/0227650 A1 * | 9/2010 | Kim | | G06F 1/1616 455/566 |
| 2012/0007796 A1 * | 1/2012 | Jokinen | | H05K 1/189 345/156 |
| 2012/0044620 A1 * | 2/2012 | Song | | G06F 1/1616 361/679.01 |
| 2012/0068798 A1 * | 3/2012 | Lauder | | G06F 1/1613 335/306 |
| 2012/0120618 A1 * | 5/2012 | Bohn | | G06F 1/1681 361/749 |
| 2012/0194448 A1 * | 8/2012 | Rothkopf | | A45C 13/002 345/173 |
| 2012/0264489 A1 * | 10/2012 | Choi | | H04M 1/0216 455/566 |
| 2013/0010405 A1 * | 1/2013 | Rothkopf | | H04M 1/0216 361/679.01 |
| 2013/0021762 A1 * | 1/2013 | van Dijk | | G06F 1/1652 361/749 |
| 2013/0235008 A1 * | 9/2013 | Kwon | | G09G 3/20 345/204 |
| 2013/0314611 A1 * | 11/2013 | Okutsu | | H04N 5/64 348/739 |
| 2014/0239065 A1 * | 8/2014 | Zhou | | G06F 1/163 235/380 |
| 2014/0267951 A1 * | 9/2014 | Lee | | G06F 3/046 349/12 |
| 2014/0320396 A1 * | 10/2014 | Modarres | | G06F 3/0412 345/156 |
| 2014/0375530 A1 * | 12/2014 | Delaporte | | G06F 1/1616 345/1.3 |
| 2015/0055286 A1 * | 2/2015 | Eguchi | | G06F 1/1652 361/679.26 |
| 2015/0116917 A1 * | 4/2015 | Aono | | G06F 1/1681 361/679.04 |
| 2015/0146387 A1 * | 5/2015 | Lee | | G06F 1/1679 361/749 |
| 2016/0085268 A1 * | 3/2016 | Aurongzeb | | G06F 1/1677 345/156 |
| 2016/0085319 A1 * | 3/2016 | Kim | | G06F 3/0346 345/156 |
| 2016/0091923 A1 * | 3/2016 | Morrison | | G06F 1/1616 345/55 |
| 2016/0105542 A1 * | 4/2016 | Lee | | H04M 1/72597 455/566 |
| 2016/0132074 A1 * | 5/2016 | Kim | | G06F 1/1652 715/769 |
| 2016/0139634 A1 * | 5/2016 | Cho | | G06F 1/1652 361/679.27 |
| 2016/0162112 A1 * | 6/2016 | Lee | | G06F 1/1652 345/173 |
| 2016/0187935 A1 * | 6/2016 | Tazbaz | | G06F 1/1681 361/679.03 |
| 2016/0324023 A1 * | 11/2016 | Kim | | H04M 1/0268 |
| 2016/0334836 A1 * | 11/2016 | Hong | | G06F 1/1616 |
| 2016/0349802 A1 * | 12/2016 | Ahn | | G06F 1/1641 |

FOREIGN PATENT DOCUMENTS

| | | |
|---|---|---|
| KR | 10-1133050 B1 | 3/2012 |
| KR | 10-1292974 B1 | 7/2013 |
| KR | 10-1346146 B1 | 12/2013 |

* cited by examiner

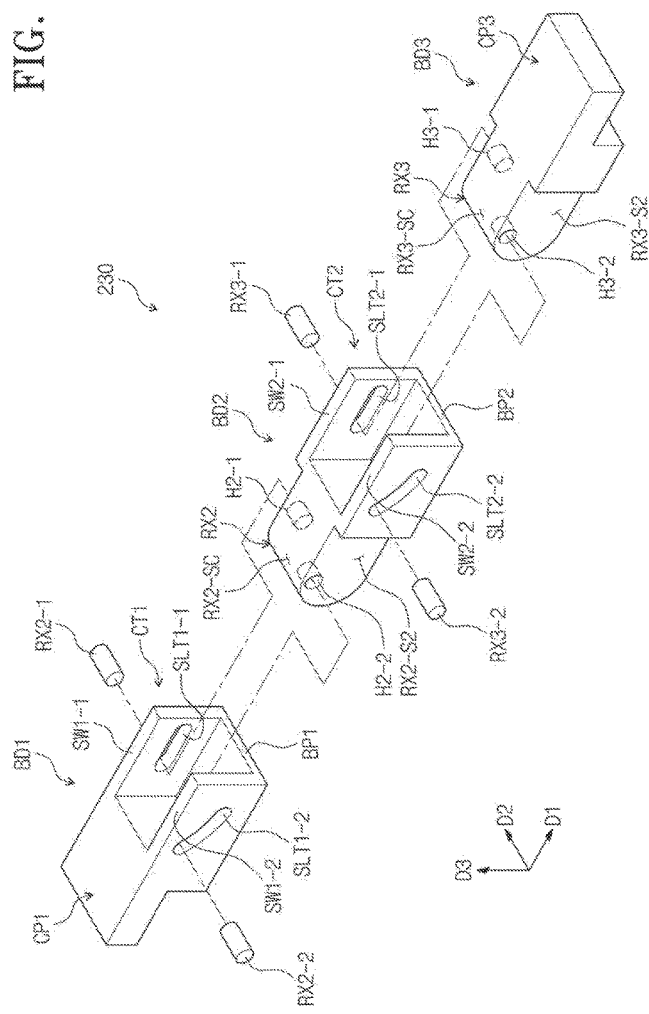

FOLDABLE DISPLAY

CROSS-REFERENCE TO RELATED APPLICATION

This U.S. non-provisional patent application claims priority under 35 U.S.C. §119 of Korean Patent Application No. 10-2015-0006987, filed on Jan. 14, 2015, the contents of which are hereby incorporated by reference in its entirety.

BACKGROUND

Field

The present disclosure generally relates to a foldable display.

Description of the Related Technology

Rollable or foldable displays include a flexible display module. Flexible display modules, which are bendable or foldable, have been undergoing active research and development. Flexible display modules include a flexible display panel and various supportive functional components. Such flexible display panels include a base substrate, various functional layers formed over the base substrate and pixels formed over the base substrate.

SUMMARY OF CERTAIN INVENTIVE ASPECTS

One inventive aspect is a foldable display including a hinge member.

Another aspect is a foldable display that can reduce deformation thereof.

Another aspect is a foldable display including a housing and a flexible display module. The housing includes a first supporting member, a second supporting member arranged to be spaced apart from the first supporting member, and a hinge member connecting the first and second supporting members. The flexible display module is connected to the first and second supporting members.

The hinge member includes a first body and a second body. The first body includes a rotation portion, a first axle engaged with one surface of the rotation portion, and a second axle engaged with the other surface of the rotation portion. The second body includes a connection portion including a first guide line facing the one surface of the rotation portion of the first body and engaged with the first axle and a second guide line facing the other surface of the rotation portion of the first body, engaged with the second axle, and having a curved line shape.

The second body further includes a fixing portion connected to the connection portion of the second body and connected to the first supporting member.

The connection portion of the second body includes a first sidewall in which the first guide line is defined and a second sidewall in which the second guide line is defined. The second sidewall is spaced apart from the first sidewall to face the first sidewall.

The first guide line is a first slit formed through the first sidewall and the second guide line is a second slit formed through the second sidewall.

The first body further includes a fixing portion connected to the rotation portion of the first body, and the fixing portion of the first body is connected to the second supporting member.

The hinge member further includes a third body. The third body includes a rotation portion, a third axle engaged with one surface of the rotation portion, and a fourth axle engaged with the other surface of the rotation portion.

The first body further includes a connection portion including a third guide line facing the one surface of the rotation portion of the third body and engaged with the third axle and a fourth guide line facing the other surface of the rotation portion of the third body and engaged with the fourth axle.

The connection portion of the first body includes a third sidewall in which the third guide line is defined and a fourth sidewall in which the fourth guide line is defined. The fourth sidewall is spaced apart from the third sidewall to face the third sidewall.

The third guide line is a third slit formed through the third sidewall and the fourth guide line is a fourth slit formed through the fourth sidewall.

The third body further includes a fixing portion connected to the rotation portion of the third body, and the fixing portion of the third body is connected to the second supporting member.

The hinge member can include a first body, a second body, and a third body. The first body includes a first axle engaged with one surface of the rotation portion, a second axle engaged with the other surface of the rotation portion, a third axle engaged with the one surface of the rotation portion and spaced apart from the first axle, and a fourth axle engaged with the other surface of the rotation portion and spaced apart from the second axle.

The second body includes a connection portion including a first guide line facing the one surface of the rotation portion and engaged with the first axle and a second guide line facing the other surface of the rotation portion and engaged with the second axle.

The third body includes a connection portion including a third guide line facing the one surface of the rotation portion and engaged with the third axle and a fourth guide line facing the other surface of the rotation portion and engaged with the fourth axle.

One guide line of the first and second guide lines has a curved line shape and one guide line of the third and fourth guide lines has the curved line shape.

The connection portion of the second body includes a first sidewall in which the first guide line is defined and a second sidewall in which the second guide line is defined. The connection portion of the third body includes a third sidewall in which the third guide line is defined and a fourth sidewall in which the fourth guide line is defined.

The second body further includes a first fixing portion connected to the first and second sidewalls and connected to the first supporting member. The third body further includes a second fixing portion connected to the third and fourth sidewalls and connected to the second supporting member.

The guide line having the curved line shape of the first and second guide lines and the guide line having the curved line shape of the third and fourth guide lines have a mirror-inverted shape when viewed in the first, second, third, and fourth sidewalls.

Each of the first, second, third, and fourth guide lines is a slit formed through a corresponding sidewall among the first, second, third, and fourth sidewalls.

The hinge member can include a first body, a second body, and a third body. The first body includes a bottom portion provided with a rotation axle, a rotation arm engaged with the rotation axle, a first connection portion comprising a first guide line having a curved line shape and a first guide slit and being formed on the bottom portion, and a second connection portion including a second guide line having the curved line shape and a second guide slit and being formed on the bottom portion to be spaced apart from the first connection portion.

The second body includes a first rotation portion, a first axle engaged with one surface of the first rotation portion and the first guide line and a second axle engaged with the other surface of the first rotation portion and engaged with the rotation arm after passing through the first guide slit.

The third body includes a second rotation portion, a third axle engaged with one surface of the second rotation portion and the second guide line and a fourth axle engaged with the other surface of the second rotation portion and engaged with the rotation arm after passing through the second guide slit.

The first body further includes a first fixing portion engaged with the first rotation portion and engaged with the first supporting member. The second body further includes a second fixing portion connected to the second rotation portion and connected to the second supporting member.

The first connection portion includes a first sidewall in which the first guide line is defined and a second sidewall spaced apart from the first sidewall, in which the first guide slit is defined. The second connection portion includes a third sidewall protruded from the bottom portion, in which the second guide line is defined, and a fourth sidewall spaced apart from the third sidewall, in which the second guide slit is defined. The second and fourth sidewalls are arranged closer to the rotation axle than the first and third sidewalls.

The first guide line crosses the second guide line. The first and second guide slits are substantially parallel to each other.

The rotation arm is provided with a through-hole into which the rotation axle is inserted and third and fourth guide lines arranged such that the thru-hole is interposed between the third and fourth guide lines. The first axle further includes a first protrusion engaged with the third guide line, and the third axle further includes a second protrusion engaged with the fourth guide line.

Another aspect is a foldable display, comprising a housing comprising: i) a first support, ii) a second support spaced apart from the first support, and iii) a hinge connecting the first and second supports to each other; a flexible display module connected to the first and second supports, wherein the hinge comprises: a first body comprising: i) a rotation portion including first and second surfaces opposing each other, ii) a first axle engaged with the first surface of the rotation portion, and iii) a second axle engaged with the second surface of the rotation portion; and a second body comprising a connection portion including first and second surfaces opposing each other, wherein a first guide line is defined in the first surface of the connection portion and engaged with the first axle, wherein a second guide line is defined in the second surface of the connection portion and engaged with the second axle, and wherein the second guide line has a curved shape.

In exemplary embodiments, the second body further comprises a fixing portion connected to the connection portion of the second body and the first support. The connection portion of the second body can comprise a first sidewall in which the first guide line is defined; and a second sidewall in which the second guide line is defined, wherein the second sidewall is spaced apart from and opposes the first sidewall. The first guide line can be a first slit formed through the first sidewall and the second guide line can be a second slit formed through the second sidewall. The first body can further comprise a fixing portion connected to the rotation portion of the first body the second support.

In exemplary embodiments, the foldable display further comprises a third body comprising: i) a rotation portion including first and second surfaces opposing each other, ii) a third axle engaged with the first surface of the rotation portion, and iii) a fourth axle engaged with the second surface of the rotation portion, wherein the first body further comprises a connection portion including third and fourth surfaces opposing each other, wherein a third guide line is defined in the third surface of the connection portion and engaged with the third axle, and wherein a fourth guide line is defined in the fourth surface of the connection portion and engaged with the fourth axle.

In exemplary embodiments, the connection portion of the first body comprises a third sidewall in which the third guide line is defined; and a fourth sidewall in which the fourth guide line is defined, wherein the fourth sidewall is spaced apart from and opposes the third sidewall. The third guide line can be a third slit formed through the third sidewall and the fourth guide line can be a fourth slit formed through the fourth sidewall. The third body can further comprise a fixing portion connected to the rotation portion of the third body and the second supporting member.

Another aspect is a foldable display, comprising a housing comprising a first support, a second support, spaced apart from the first support, and a hinge connecting the first and second supports to each other; and a flexible display module connected to the first and second supports, wherein the hinge comprises: a first body having first and second surfaces opposing each other, wherein the first body comprises: i) a first axle engaged with the first surface of the first body, ii) a second axle engaged with the second surface of the first body, iii) a third axle engaged with the first surface of the first body and spaced apart from the first axle, and iv) a fourth axle engaged with the second surface of the first body and spaced apart from the second axle; a second body comprising a connection portion including: i) a first guide line facing the first surface of the first body and engaged with the first axle and ii) a second guide line facing the second surface of the first body and engaged with the second axle; and a third body comprising a connection portion including: i) a third guide line facing the first surface of the first body and engaged with the third axle and ii) a fourth guide line facing the second surface of the rotation portion and engaged with the fourth axle, wherein one of the first and second guide lines has a curved line shape and one of the third and fourth guide lines has a curved line shape.

In exemplary embodiments, the connection portion of the second body comprises a first sidewall in which the first guide line is defined; and a second sidewall in which the second guide line is defined, and wherein the connection portion of the third body comprises: a third sidewall in which the third guide line is defined; and a fourth sidewall in which the fourth guide line is defined. The second body can further comprise a first fixing portion connected to the first and second sidewalls and the first support and the third body can further comprise a second fixing portion connected to the third and fourth sidewalls and the second support.

In exemplary embodiments, the guide lines that have the curved line shapes have a substantially mirror-inverted shape. Each of the first, second, third, and fourth guide lines can be a slit formed through a corresponding sidewall among the first, second, third, and fourth sidewalls.

Another aspect is a foldable display, comprising a housing comprising a first support, a second support, spaced apart from the first support, and a hinge connecting the first and second supports to each other; and a flexible display module connected to the first and second supports, wherein the hinge comprises: a first body comprising: i) a bottom portion, ii) a rotation axle formed over the bottom portion, iii) a rotation arm engaged with the rotation axle, iv) a first connection portion including a first guide line having a curved line shape and a first guide slit and v) a second connection portion including a second guide line having the curved line shape and a second guide slit, wherein the first and second connection portions are formed over the bottom portion and are spaced apart from each other; a second body comprising: i) a first rotation portion including first and second surfaces opposing each other, ii) a first axle engaged with the first surface of the first rotation portion and the first guide line and iii) a second axle engaged with the second surface of the first rotation portion and the rotation arm after passing through the first guide slit; and a third body comprising: i) a second rotation portion including third and fourth surfaces opposing each other, ii) a third axle engaged with the third surface of the second rotation portion and the second guide line and iii) a fourth axle engaged with the fourth surface of the second rotation portion and the rotation arm after passing through the second guide slit.

In exemplary embodiments, the second body further comprises a first fixing portion connected to the first rotation portion and the first support and wherein the third body further comprises a second fixing portion connected to the second rotation portion and the second support.

In exemplary embodiments, the first connection portion comprises a first sidewall in which the first guide line is defined and a second sidewall spaced apart from the first sidewall, in which the first guide slit is defined, wherein the second connection portion comprises a third sidewall in which the second guide line is defined and a fourth sidewall spaced apart from the third sidewall, in which the second guide slit is defined, and wherein the second and fourth sidewalls are arranged closer to the rotation axle than the first and third sidewalls.

In exemplary embodiments, the first guide line crosses the second guide line. The first and second guide slits can be substantially parallel to each other. The rotation arm can have i) a though-hole into which the rotation axle is inserted and ii) third and fourth guide lines defined on opposing sides of the through-hole, the second axle can further comprise a first protrusion engaged with the third guide line, and the fourth axle can further comprise a second protrusion engaged with the fourth guide line.

According to at least one embodiment, the hinge member is operated when the foldable display is folded, and thus the deformation in the flexible display module can be reduced. The folding area is maintained at a substantially constant length by the housing since the flexible display module is folded by the two axles of the hinge member moving the two guide lines. Thus, the flexible display module can be stably protected by the housing.

BRIEF DESCRIPTION OF THE DRAWINGS

The above and other advantages of the present disclosure will become readily apparent by reference to the following detailed description when considered in conjunction with the accompanying drawings.

FIG. 3D is an exploded perspective view showing a hinge member according to an exemplary embodiment.

DETAILED DESCRIPTION OF CERTAIN INVENTIVE EMBODIMENTS

Figure 1A:
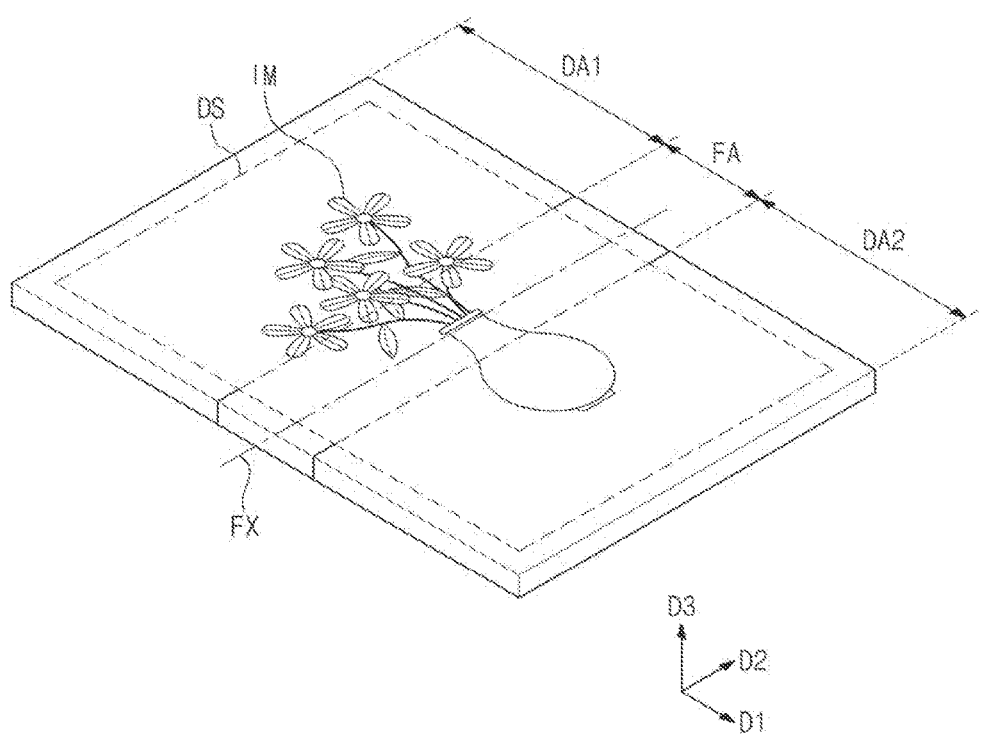
FIG. 1A is a perspective view showing a foldable display according to an exemplary embodiment.

It will be understood that when an element or layer is referred to as being "on", "connected to" or "coupled to" another element or layer, it can be directly on, connected or coupled to the other element or layer or intervening elements or layers may also be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein are to be interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the described technology will be explained in detail with reference to the accompanying drawings.

Figure 1B:
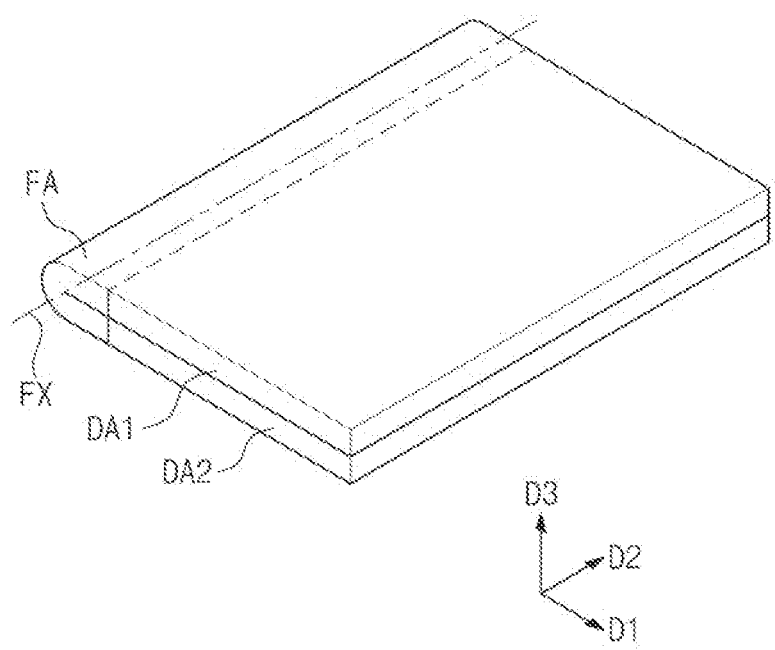
FIG. 1B is a perspective view showing a foldable display in a folded state according to an exemplary embodiment.
Figure 2A:
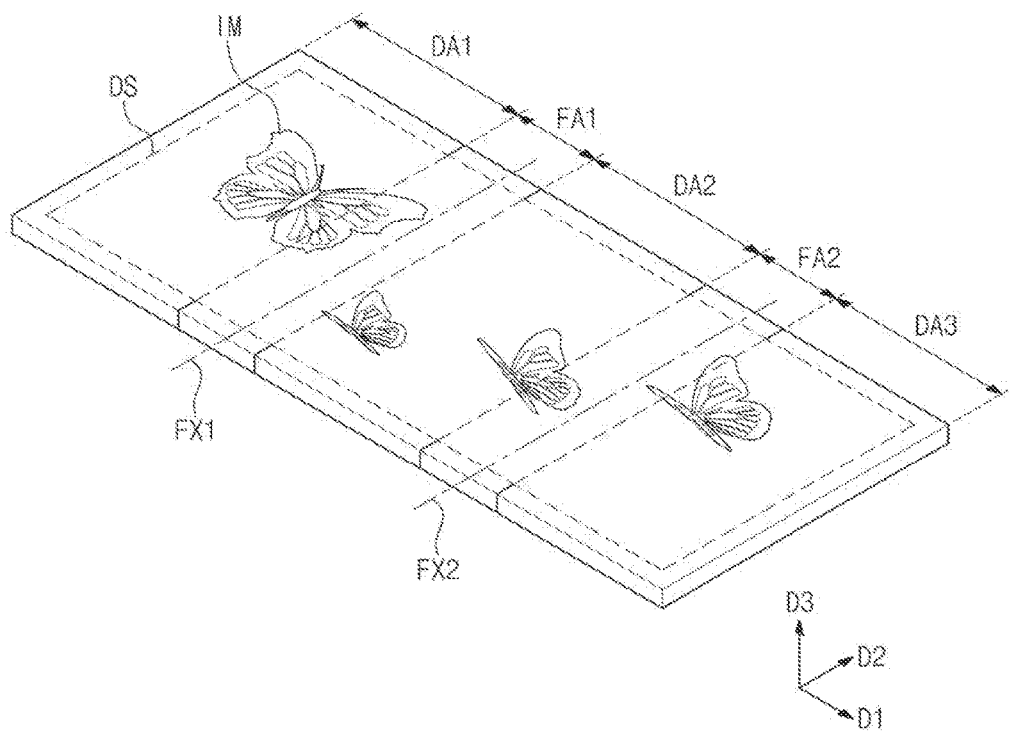
FIG. 2A is a perspective view showing a foldable display according to an exemplary embodiment.
Figure 2B:
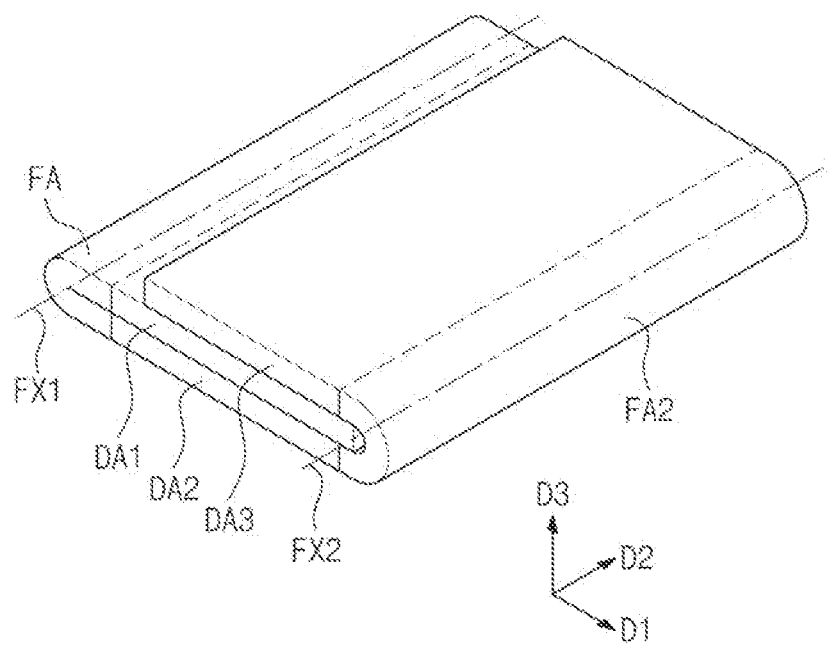
FIG. 2B is a perspective view showing a foldable display in a folded state according to an exemplary embodiment.

FIG. 1A is a perspective view showing a foldable display according to an exemplary embodiment. FIG. 1B is a perspective view showing a foldable display in a folded state according to an exemplary embodiment. FIG. 2A is a perspective view showing a foldable display according to an exemplary embodiment. FIG. 2B is a perspective view showing a foldable display in a folded state according to an exemplary embodiment.

Referring to FIGS. 1A and 1B, the foldable display includes a first display area DA1, a second display area DA2, and a folding area FA. In contrast to the embodiment of the foldable display shown in FIGS. 1A and 1B, the foldable display can also include two or more folding areas.

The folding area FA is interposed between the first and second display areas DA1 and DA2. A folding axis FX is defined in the folding area FA. The folding axis FX serves as a rotation axis when the foldable display is folded.

The foldable display includes a display surface DS on which an image IM is displayed. The display surface DS includes a display surface of the first display area DA1, a display surface of the second display area DA2, and a display surface of the folding area FA. In the present exemplary embodiment, a first direction DR1 and a second direction DR2 define the display surface DS when the foldable display is unfolded. A third direction DR3 indicates the thickness direction of the foldable display and the second direction DR2 indicates the direction in which the folding axis FX extends.

Referring to FIG. 1B, the foldable display can be folded along the folding axis FX such that the display surface of the first display area DA1 faces the display surface of the second display area DA2. Hereinafter, the configuration of the foldable display in which the foldable display folded such that the display surfaces of different areas face each other is referred to as an inner folding. In the present exemplary embodiment, when the first display area DA1 is rotated in a clockwise direction with respect to the folding axis FX, the foldable display is inner folded. In some embodiments, to inner fold the foldable display such that the first display area DA1 is aligned with the second display area DA2, the folding axis FX is defined at a center of the foldable display along the first direction DR1.

Although not shown in figures, the foldable display can be folded with respect to the folding axis FX to allow the display surfaces of the first and second display areas DA1 and DA2 are toward the outside of the foldable display. Hereinafter, the folded state allowing the display surfaces of the different areas to face the outside of the foldable display is referred to as an outer folding.

Referring to FIGS. 1A and 1B, when the display surface of the first display area DA1 and the display surface of the second display area DA2 are exposed to the outside, an image IM can be displayed. In addition, the image IM can be displayed in the display surface of the folding area FA exposed to the outside. As shown in FIG. 1A, the image IM can be displayed when the foldable display is in an unfolded state. The first display area DA1, the second display area DA2, and the folding area FA can respectively display images including independent information or respectively display different portions of one image including continuous information, for example, a single image can be displayed by the first and second display areas DA1 and DA2 and the folding area FA.

Referring to FIGS. 2A and 2B, the foldable display can include a plurality of folding areas FA1 and FA2. In the present exemplary embodiment, the foldable display including two folding areas FA1 and FA2 will be described.

The foldable display includes first, second, and third display areas DA1, DA2, and DA3 and first and second folding areas FA1 and FA2. When the foldable display is in the unfolded state, the first folding area FA1 is interposed between the first and second display areas DA1 and DA2 and the second folding area FA2 is interposed between the second and third display areas DA2 and DA3. First and second folding axes FX1 and FX2 are respectively defined in the first and second folding areas FA1 and FA2. The foldable display can be inner-folded or outer-folded.

As shown in FIG. 2B, the foldable display can be inner-folded in the first folding area FA1 along the first folding axis FX1 and inner-folded in the second folding area FA2 along the second axis FX2. As shown in FIGS. 2A and 2B, when the display surface of the first display area DA1, the display surface of the second display area DA2, and the display surface of the third display area DA3 are exposed to the outside, the image IM can be displayed by the foldable display. In addition, the image IM can be displayed by the display surface of the first folding area FA1 and the display surface of the second folding area FA2, which are exposed to the outside.

Figure 3A:
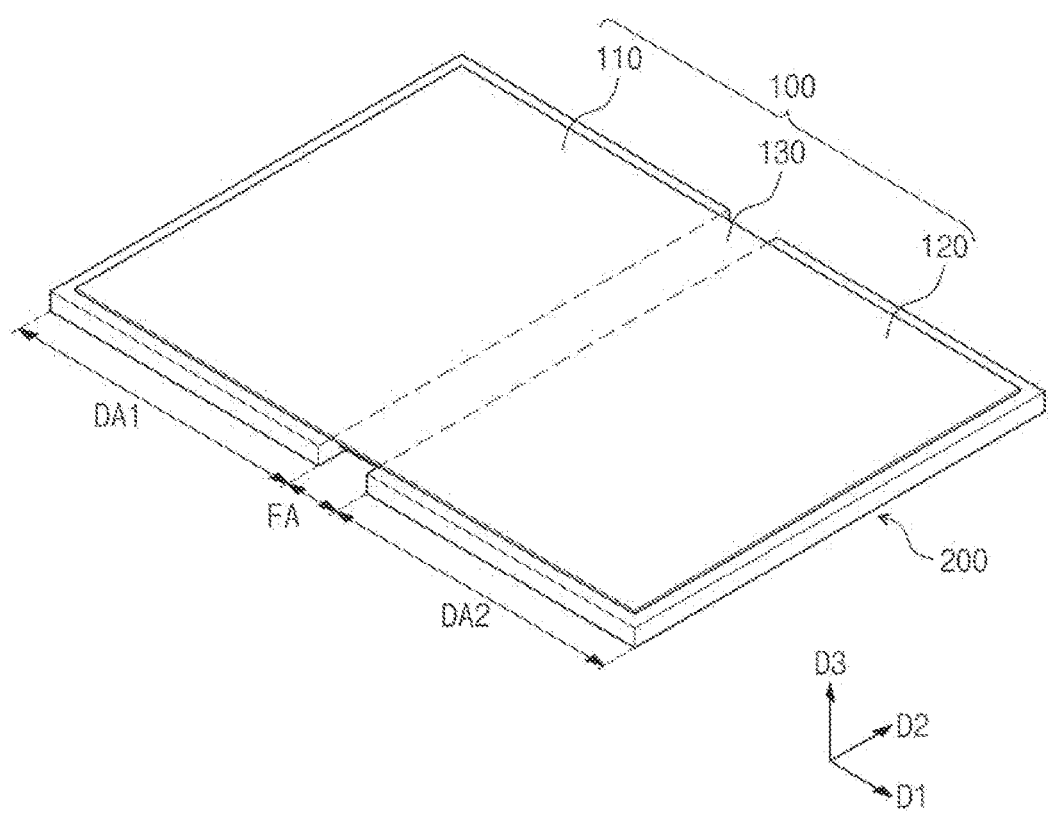
FIG. 3A is a perspective view showing a foldable display according to an exemplary embodiment.
Figure 3B:
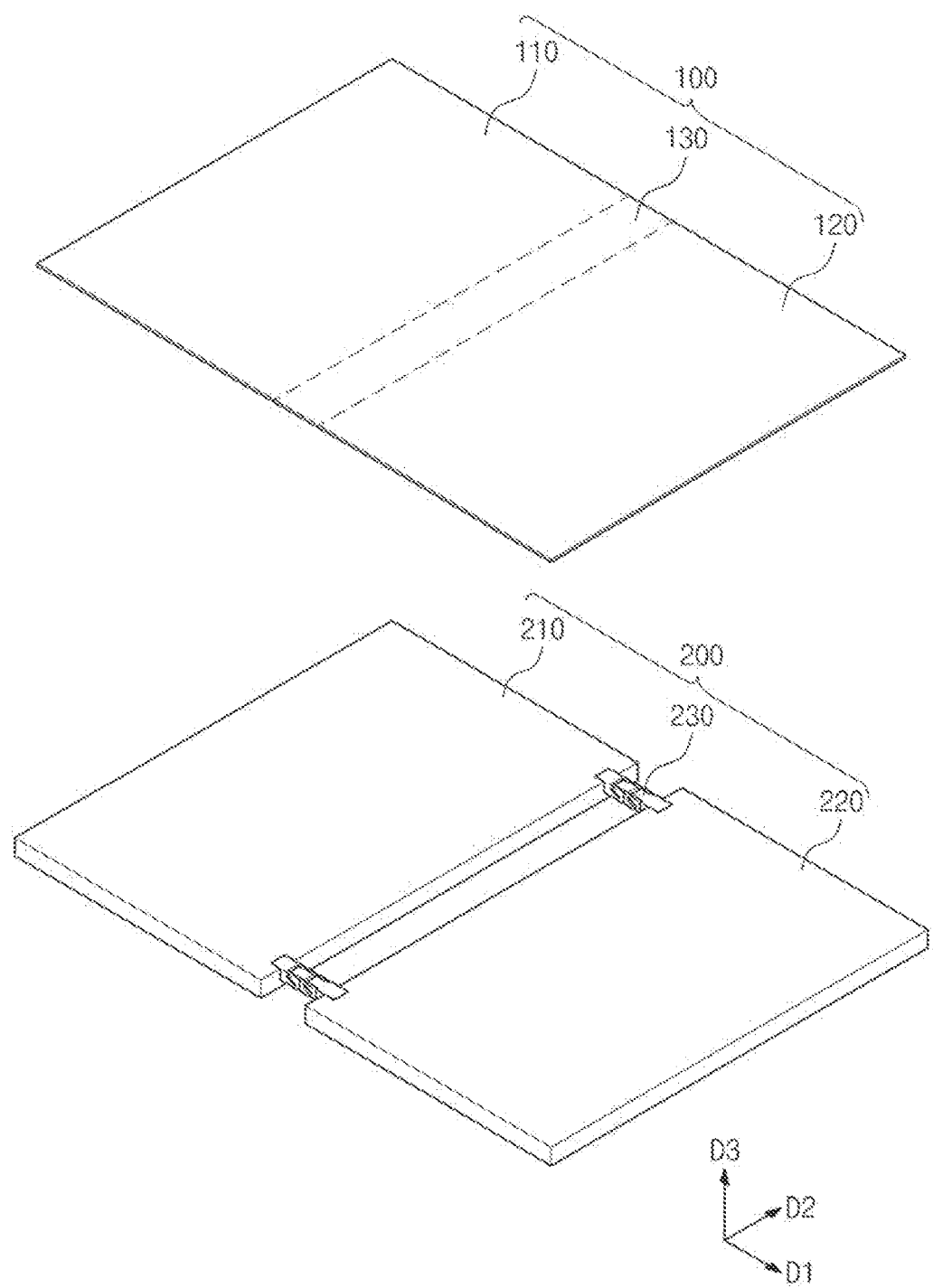
FIG. 3B is an exploded perspective view showing a foldable display according to an exemplary embodiment.
Figure 3C:
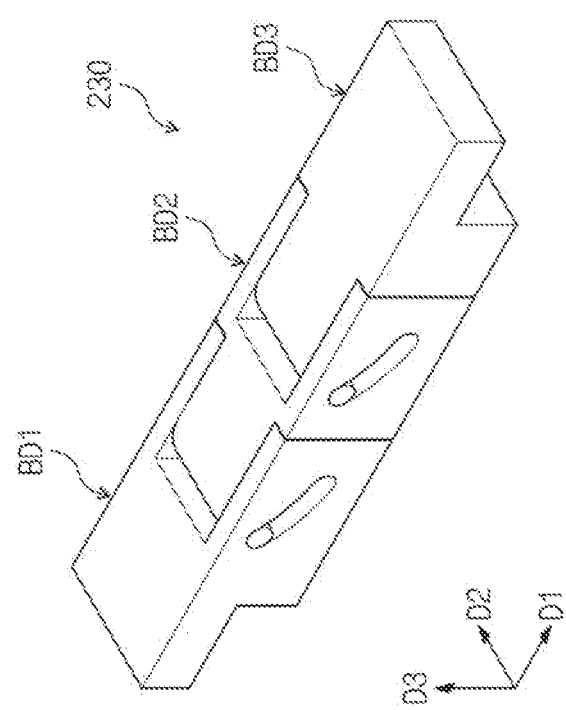
FIG. 3C is a perspective view showing a hinge member according to an exemplary embodiment.
Figure 3E:
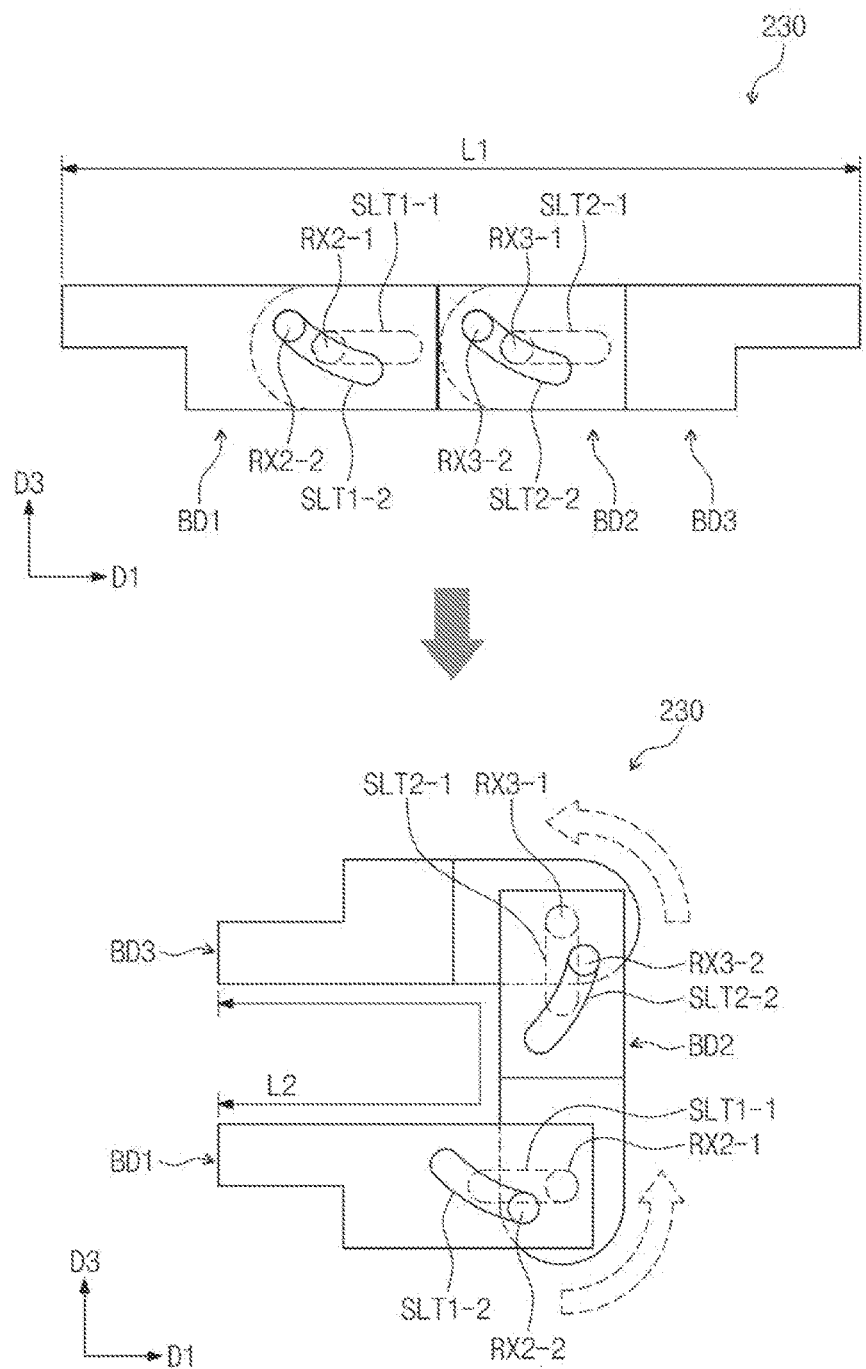
FIG. 3E is a side view showing the operation of a hinge member according to an exemplary embodiment.

FIG. 3A is a perspective view showing a foldable display according to an exemplary embodiment. FIG. 3B is an exploded perspective view showing a foldable display according to an exemplary embodiment. FIG. 3C is a perspective view showing a hinge member or hinge 230 according to an exemplary embodiment. FIG. 3D is an exploded perspective view showing the hinge member 230 according to an exemplary embodiment. FIG. 3E is a side view showing the operation of the hinge member 230 according to an exemplary embodiment.

The hinge member 230 shown in FIGS. 3A to 3E can be applied to the first and second folding areas FA1 and FA2 shown in FIGS. 2A and 2B.

Referring to FIGS. 3A and 3B, the foldable display includes a flexible display module 100 (hereinafter, referred to as a display module) and a housing 200. The display module 100 is partially or entirely connected to the housing 200. The connective structure connecting the display module 100 and the housing 200 should not be limited to a specific structure. For instance, the housing 200 can provides a substantially flat plane surface on which the display module 100 is arranged. In the present exemplary embodiment, the housing 200 defines a predetermined space and the display module 100 is accommodated in the predetermined space. The housing 200 defines a stepped space therein and the display module 100 is accommodated in the stepped space.

The display module 100 can be entirely rolled or folded at a specific area. The display module 100 includes at least a flexible display panel and various functional members. The display panel can be an organic light-emitting diode (OLED) display panel, an electrophoretic display (EPD) panel, or an electrowetting display (EWD) panel. The functional members can include a protective member, an optical member, and a touch panel.

The display module 100 includes a first area 110, a second area 120, and a third area 130 respectively corresponding to the first display area DA1, the second display area DA2, and the folding area FA, which are described with reference to FIGS. 1A to 1C. The first area 110, the second area 120, and the third area 130 are virtual areas separated from each other by the housing 200.

The housing 200 includes a plurality of sections with are connected to each other. The housing 200 includes a first supporting member or a first support 210, a second supporting member or a second support 220 arranged to be spaced from the first supporting member 210, and the hinge member 230 connecting the first and second supporting members 210 and 220. The number of the supporting members corresponds to the number of the display areas DA1 and DA2.

The first and second supporting members 210 and 220 respectively support the first and second areas 110 and 120 and are respectively connected to the first and second areas 110 and 120. Each of the first and second supporting members 210 and 220 can includes a plurality of sections that are connected to each other or can be integrally formed in a single unitary and individual unit via, for example, injection molding or extrusion molding.

FIGS. 3A and 3B show two hinge members 230 spaced apart from each other in the second direction DR2. The number of the hinge members 230 should not be limited to two. Each of the two hinge members 230 connects the first and second supporting members 210 and 220 to each other. One end of each of the two hinge members 230 is connected to the first supporting member 210 and the other end of each of the two hinge members 230 is connected to the second supporting member 220. Hereinafter, the hinge member 230 will be described in detail with reference to FIGS. 3C to 3E.

Referring to FIGS. 3C and 3D, the hinge member 230 includes a plurality of bodies BD1, BD2, and BD3 that are connected to each other. FIGS. 3C to 3E show an embodiment of the hinge member 230 that includes three bodies.

The first body BD1 includes a connection portion CT1 and a fixing portion CP1. The connection portion CT1 and the fixing portion CP1 can be integrally formed in a single unitary and individual unit or can be separately formed and connected to each other. The connection portion CT1 includes a first guide line SLT1-1 and a second guide line SLT1-2. One of the first and second guide lines SLT1-1 and SLT1-2 has a straight line shape and the other of the first and second guide lines SLT1-1 and SLT1-2 has a curved line shape.

The connection portion CT1 includes a bottom BP1, a first sidewall SW1-1, and a second sidewall SW1-2. The first sidewall SW1-1 is protruded from the bottom BP1 and the first guide line SLT1-1 is defined in the first sidewall SW1-1. The second sidewall SW1-2 is protruded from the bottom BP1 and the second guide line SLT1-2 is defined in the second sidewall SW1-2. The second sidewall SW1-2 is spaced apart from the first sidewall SW1-1 in the second direction DR2 and faces the first sidewall SW1-1.

The first guide line SLT1-1 corresponds to a slit formed through the first sidewall SW1-1 and the second guide line SLT1-2 corresponds to a slit formed through the second sidewall SW1-2. The first and second guide lines SLT1-1 and SLT1-2 should not be limited to the slit as long as the first and second guide lines SLT1-1 and SLT1-2 guide the rotation of the first and second bodies DB1 and BD2. In the present exemplary embodiment, the first and second guide lines SLT1-1 and SLT1-2 can be grooves respectively defined in an inner surface of the first sidewall SW1-1 and an inner surface of the second sidewall SW1-2.

The first guide line SLT1-1 crosses the second guide line SLT1-2 when viewed in a plan view defined by the first and third directions DR1 and DR3. The second guide line SLT1-2 has the curved line shape extending from an upper portion of the second sidewall SW1-2 to a lower portion of the second sidewall SW1-2. The first guide line SLT1-1 has the straight line shape extending from a left portion of the first sidewall SW1-1 to a right portion of the first sidewall SW1-1.

The fixing portion CP1 is connected to the bottom BP1, the first sidewall SW1-1, and the second sidewall SW1-2. The hinge member 230 is connected to the first supporting member 210 through the fixing portion CP1. In some exemplary embodiment, the fixing portion CP1 can be omitted. In these embodiments, the connection portion CT1 can be directly connected to the first supporting member 210.

In some exemplary embodiments, the bottom BP1 of the connection portion CT1 can be omitted. In these embodiments, the first and second sidewalls SW1-1 and SW1-2 can be the only elements connected to the fixing member CT1 or can be directly connected to the first supporting member 210.

The second body BD2 includes a rotation portion RX2, a first axle RX2-1, a second axle RX2-2, and a connection portion CT2. The first axle RX2-1 is engaged with one surface of the rotation portion RX2 and the second axle RX2-2 is engaged with the other surface RX2-S2 of the rotation portion RX2. The one surface of the rotation portion RX2 not illustrated in FIG. 3D. The one surface of the rotation portion RX2 and the other surface RX2-S2 of the rotation portion RX2 oppose each other in the second direction DR2. A first insertion hole H2-1 engaged with the first axle RX2-1 is defined through the one surface of the rotation portion RX2 and a second insertion hole H2-2 engaged with the second axle RX2-2 is defined through the other surface RX2-S2 of the rotation portion RX2.

The rotation portion RX2 is inserted into a space defined by the connection portion CT1 of the first body BD1, i.e., by the first and second sidewalls SW1-1 and SW1-2. The rotation portion RX2 includes a curved surface RX2-SC connecting the one surface and the other surface RX2-S2 of the rotation portion RX2. The first axle RX2-1 is inserted into the first insertion hole H2-1 through the first guide line SLT1-1 and the second axle RX2-2 is inserted into the second insertion hole H2-2 through the second guide line SLT1-2. The first and second axles RX2-1 and RX2-2 are formed in different positions from each other. A line extending through a central axis the first axle RX2-1 and a line extending through a central axis of the second axle RX2-2 are substantially parallel to the second direction DR2 but do not overlap each other.

The connection portion CT2 includes a bottom BP2, a first sidewall SW2-1, and a second sidewall SW2-2, which are connected to the rotation portion RX2. In some exemplary embodiments, the bottom BP2 is omitted. First and second guide lines SLT2-1 and SLT2-2 are respectively defined in the first and second sidewalls SW2-1 and SW2-2. The first and second sidewalls SW2-1 and SW2-2 respectively correspond to the first and second sidewalls SW1-1 and SW1-2 of the first body BD1. The first and second guide lines SLT2-1 and SLT2-2 respectively correspond to the first and second guide lines SLT1-1 and SLT1-2 of the first body BD1. The connection portion CT2 of the second body BD2 can have substantially the same structure and functions as that of the first body BD1, and thus details thereof will be omitted.

The third body BD3 includes a rotation portion RX3, a first axle RX3-1, a second axle RX3-2, and a fixing portion CP3. The first axle RX3-1 is engaged with one surface of the rotation portion RX3 and the second axle RX3-2 is engaged with the other surface RX3-S2 of the rotation portion RX3. The one surface of the rotation portion RX3 and the other surface RX3-S2 of the rotation portion RX3 oppose each other in the second direction DR2. A first insertion hole H3-1 engaged with the first axle RX3-1 is defined through the one surface of the rotation portion RX3 and a second insertion hole H3-2 engaged with the second axle RX3-2 is defined through the other surface RX3-S2 of the rotation portion RX3.

The rotation portion RX3 is inserted into a space defined by the connection portion CT2 of the second body BD2, i.e., by the first and second sidewalls SW2-1 and SW2-2. The rotation portion RX3 includes a curved surface RX3-SC connecting the one surface and the other surface RX3-S2 of the rotation portion RX3. The first axle RX3-1 is inserted into the first insertion hole H3-1 through the first guide line SLT2-1 and the second axle RX3-2 is inserted into the second insertion hole H3-2 through the second guide line SLT2-2.

The hinge member 230 is connected to the second supporting member 220 by the fixing portion CP3. The fixing portion CP3 has a stepped shape.

In some exemplary embodiments, the second body BD2 is omitted, and in these embodiments, the third body BD3 can be directly connected to the first body BD1. The rotation portion RX3 of the third body BD3 can be inserted into the space defined by the first and second sidewalls SW1-1 and SW1-2.

Referring to FIG. 3E, when the display module 100 (refer to FIGS. 3A and 3B) is in the unfolded state, the first, second, and third bodies BD1, BD2, and BD3 are aligned in the first direction DR1. The first and second axles RX2-1 and RX2-2 of the second body BD2 are arranged at one end, e.g., the left end as illustrated in FIG. 3E, of the first and second guide lines SLT1-1 and SLT1-2 of the first body BD1. The first and second axles RX3-1 and RX3-2 of the third body BD3 are arranged at one end, e.g., the left end as illustrated in FIG. 3E, of the first and second guide lines SLT2-1 and SLT2-2 of the second body BD2.

When the foldable display is folded by an external force, the first and second axles RX2-1 and RX2-2 of the second body BD2 respectively move along the first and second guide lines SLT1-1 and SLT1-2 of the first body BD1. When the rotation portion RX2 of the second body BD2 is rotated, the first and second axles RX2-1 and RX2-2 of the second body BD2 move to the other end, e.g., the right end as illustrated in FIG. 3E, of the first and second guide lines SLT1-1 and SLT1-2 of the first body BD1. When the rotation portion RX3 of the third body BD3 is rotated, the first and second axles RX3-1 and RX3-2 of the third body BD3 move to the other end, e.g., the right end as illustrated in FIG. 3E, of the first and second guide lines SLT2-1 and SLT2-2 of the second body BD2.

As described above, since the display module 100 is folded while the two axles RX2-1, RX2-2, RX3-1, and RX3-2 of each of the second and third bodies BD1 and BD2 move along two guide lines SLT1-1, SLT1-2, SLT2-1, and SLT2-2 of a corresponding body of the first and second bodies BD1 and BD2, the length of the folding area FA, which is in the folded state, does not become less than that of the folding area FA, which is in the unfolded state. That is, the folding area FA maintains a substantially constant length due to the structure of the housing 200 (refer to FIGS. 3A and 3B).

Here, the length of the folding area FA generally refers to the length in the second direction DR2. When the folding area FA in the unfolded state has a first length L1, the folding area FA in the folded state can have a second length L2 that is substantially equal to the first length L1. Accordingly, the display module 100 arranged inside the housing 200 can be inner-folded while maintaining the constant length thereof. That is, the display module 100 can be stably protected by the housing 200 without compressing or extending the length of the display module 100.

Figure 4A:
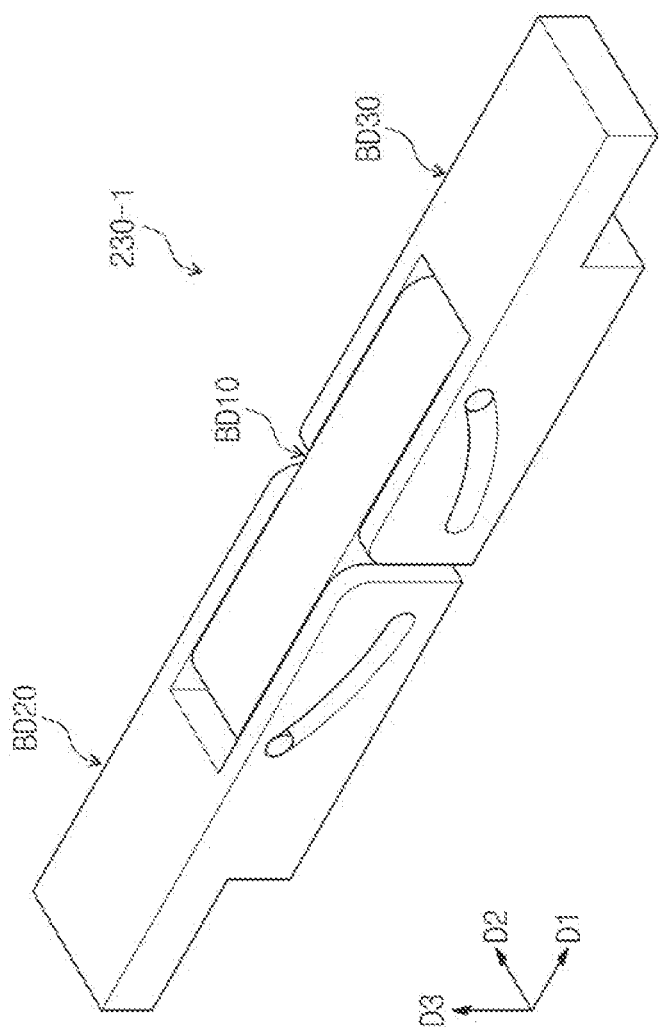
FIG. 4A is a perspective view showing a hinge member according to an exemplary embodiment.
Figure 4B:
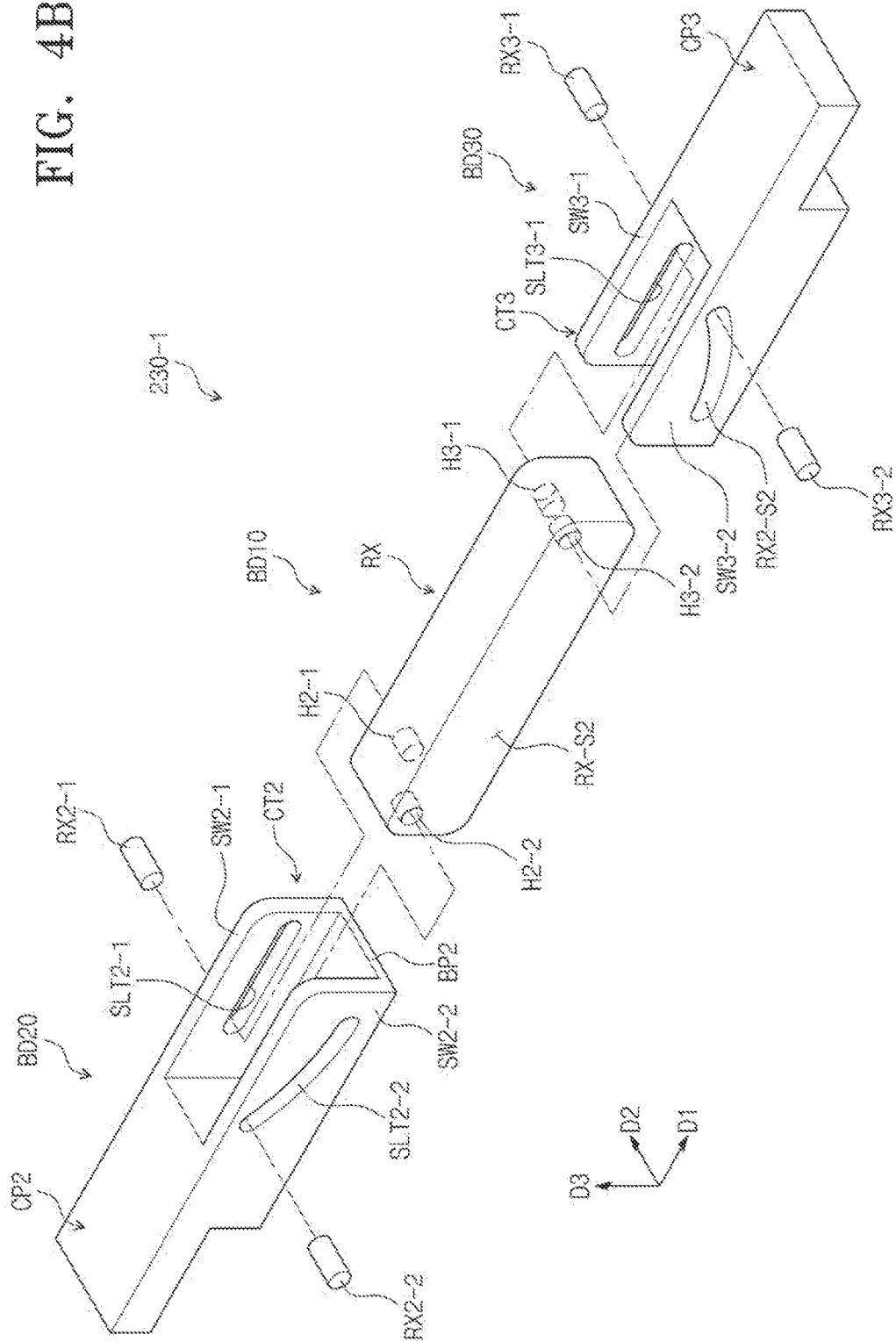
FIG. 4B is an exploded perspective view showing a hinge member according to an exemplary embodiment.
Figure 4C:
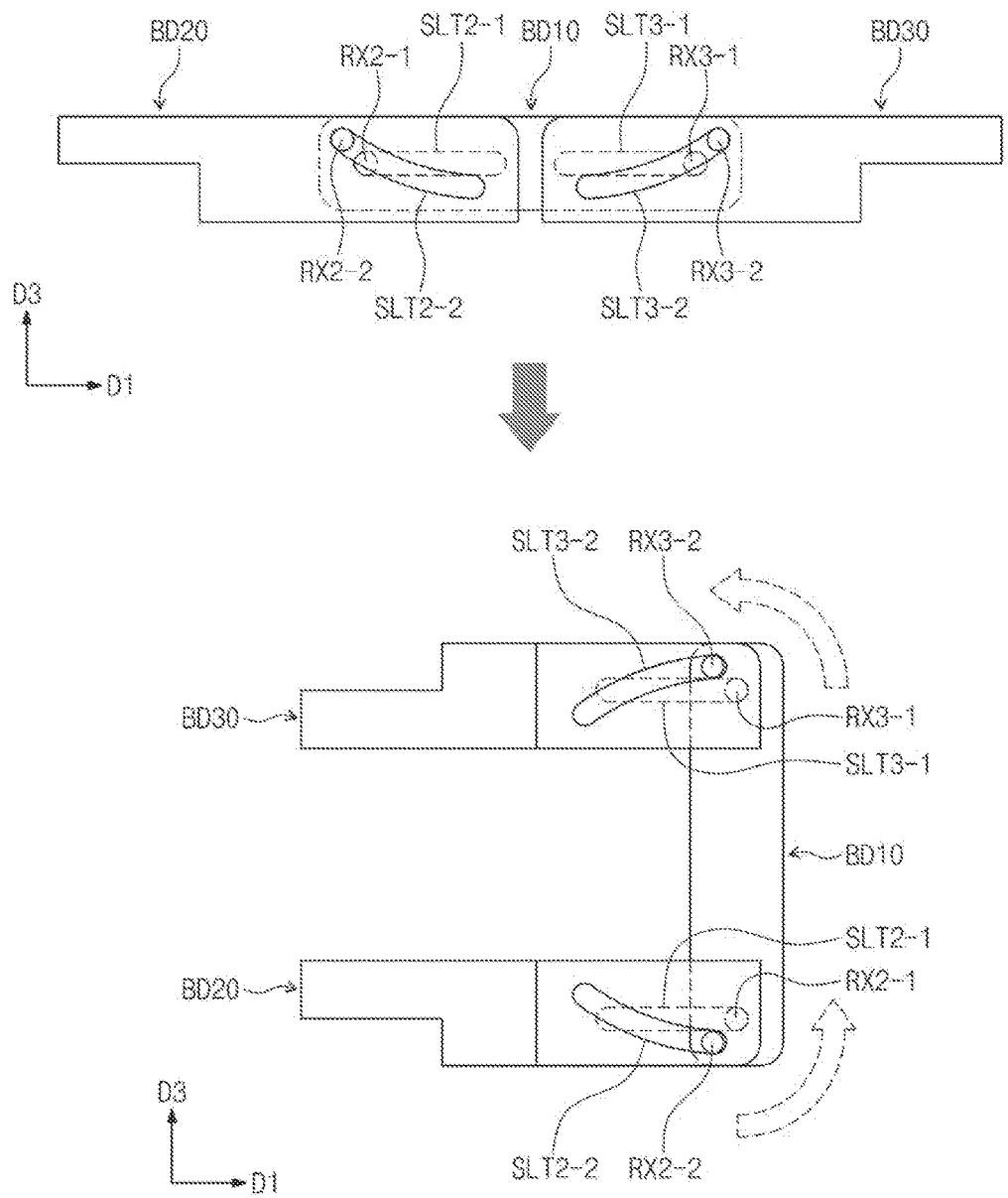
FIG. 4C is a side view showing the operation of a hinge member according to an exemplary embodiment.

FIG. 4A is a perspective view showing a hinge member 230-1 according to an exemplary embodiment. FIG. 4B is an exploded perspective view showing the hinge member 230-1 according to an exemplary embodiment. FIG. 4C is a side view showing the operation of the hinge member 230-1 according to an exemplary embodiment. In FIGS. 4A to 4C, the same reference numerals denote the same elements in FIGS. 3A to 3E, and thus detailed descriptions of the same elements will be omitted. The hinge member 230-1 described hereinafter is arranged in the folding area FA and the configuration of the housing 200 should not be limited to a specific structure.

Referring to FIGS. 4A and 4B, the hinge member 230-1 includes a first body BD10, a second body BD20, and a third body BD30. The second and third bodies BD20 and BD30 are connected to the first body BD10.

The first body BD10 includes a rotation portion RX, a first axle RX2-1 engaged with one surface of the rotation portion RX, a second axle RX2-2 engaged with the other surface RX-S2 of the rotation portion RX, a third axle RX3-1 engaged with the one surface of the rotation portion RX and spaced apart from the first axle RX2-1, and a fourth axle RX3-2 engaged with the other surface RX-S2 of the rotation portion RX and spaced apart from the second axle RX2-2.

First and third insertion holes H2-1 and H3-1 are respectively engaged with the first and third axles RX2-1 and RX3-1 and are defined through the one surface of the rotation portion RX. Second and fourth insertion holes H2-2 and H3-2 are respectively engaged with the second and fourth axles RX2-2 and RX3-2 and are defined through the other surface RX-S2 of the rotation portion RX.

The second body BD20 includes a fixing portion CP2 and a connection portion CT2. The hinge member 230-1 is connected to the first supporting member 210 (refer to FIGS. 3A and 3B) by the fixing portion CP2. In some exemplary embodiments, the fixing portion CP2 is omitted.

The connection portion CT2 includes a bottom BP2, a first sidewall SW2-1, and a second sidewall SW2-2. In some exemplary embodiments, the bottom BP2 is omitted. The first sidewall SW2-1 is protruded from the bottom BP2 and the first guide line SLT2-1 is defined in the first sidewall SW2-1. The second sidewall SW2-2 is protruded from the bottom BP2 and the second guide line SLT2-2 is defined in the second sidewall SW2-2. One of the first and second guide lines SLT2-1 and SLT2-2 has a straight line shape and the other of the first and second guide lines SLT2-1 and SLT2-2 has a curved line shape. FIG. 4A shows the second guide line SLT2-2 as having the curved line shape.

The first and second guide lines SLT2-1 and SLT2-2 have a slit shape. The first guide line SLT2-1 crosses the second guide line SLT2-2 when viewed in the first and second sidewalls SW2-1 and SW2-2. The second guide line SLT2-2 has a curved line shape extending from an upper portion of the second sidewall SW2-2 to a lower portion of the second sidewall SW2-2. The first guide line SLT2-1 has a substantially straight line shape extending from a left portion of the first sidewall SW2-1 to a right portion of the first sidewall SW2-1.

The third body BD30 includes a fixing portion CP3 and a connection portion CT3. The third body BD30 has substantially the same structure and functions as that of the second body BD20, and thus detailed descriptions of the third body BD30 will be omitted.

The hinge member 230-1 is connected to the second supporting member 220 (refer to FIGS. 3A and 3B) by the fixing portion CP3. The third body BD30 includes a bottom BP3, a first sidewall SW3-1, and a second sidewall SW3-2. A first guide line SLT3-1 is defined through the first sidewall SW3-1 and a second guide line SLT3-2 is defined through the second sidewall SW3-2.

The first guide line SLT3-1 crosses the second guide line SLT3-2 when viewed in the first and second sidewalls SW3-1 and SW3-2. The second guide line SLT3-2 has a curved line shape extending from an upper portion of the second sidewall SW3-2 to a lower portion of the second sidewall SW3-2. The first guide line SLT3-1 has a substantially straight line shape extending from a left portion of the first sidewall SW3-1 to a right portion of the first sidewall SW3-1.

The second guide line SLT2-2 of the second body BD20 and the second guide line SLT3-2 of the third body BD30 have a substantially mirror-inverted shape when viewed in a plan view defined by the first and third directions DR1 and DR3.

Referring to FIG. 4C, when the display module 100 (refer to FIGS. 3A and 3B) is in the unfolded state, the first, second, and third bodies BD10, BD20, and BD30 are aligned in the first direction DR1. The first and second axles RX2-1 and RX2-2 are arranged at one end, e.g., the left end as illustrated in FIG. 4C, of the first and second guide lines SLT2-1 and SLT2-2 of the second body BD20. The third and fourth axles RX3-1 and RX3-2 are arranged at one end, e.g., the right end as illustrated in FIG. 4C, of the first and second guide lines SLT3-1 and SLT3-2 of the third body BD3.

When the foldable display is folded, the first and second axles RX2-1 and RX2-2 respectively move along the first and second guide lines SLT2-1 and SLT2-2 of the second body BD20. When the rotation portion RX is rotated, the first and second axles RX2-1 and RX2-2 move to the other end, e.g., the right end as illustrated in FIG. 4C, of the first and second guide lines SLT2-1 and SLT2-2 of the second body BD20. When the third body BD30 is rotated, the third and fourth axles RX3-1 and RX3-2 move to the other end, e.g., the left end as illustrated in FIG. 4C, of the first and second guide lines SLT3-1 and SLT3-2 of the third body BD30.

As described above, since the foldable display is folded while the four axles RX2-1, RX2-2, RX3-1, and RX3-2 respectively move along the guide lines SLT2-1, SLT2-2, SLT3-1, and SLT3-2, the length of the folding area FA in the folded state does not become less than that of the folding area FA in the unfolded state. That is, the folding area FA maintains a substantially constant length due to the structure of the housing 200 (refer to FIGS. 3A and 3B).

Figure 5A:
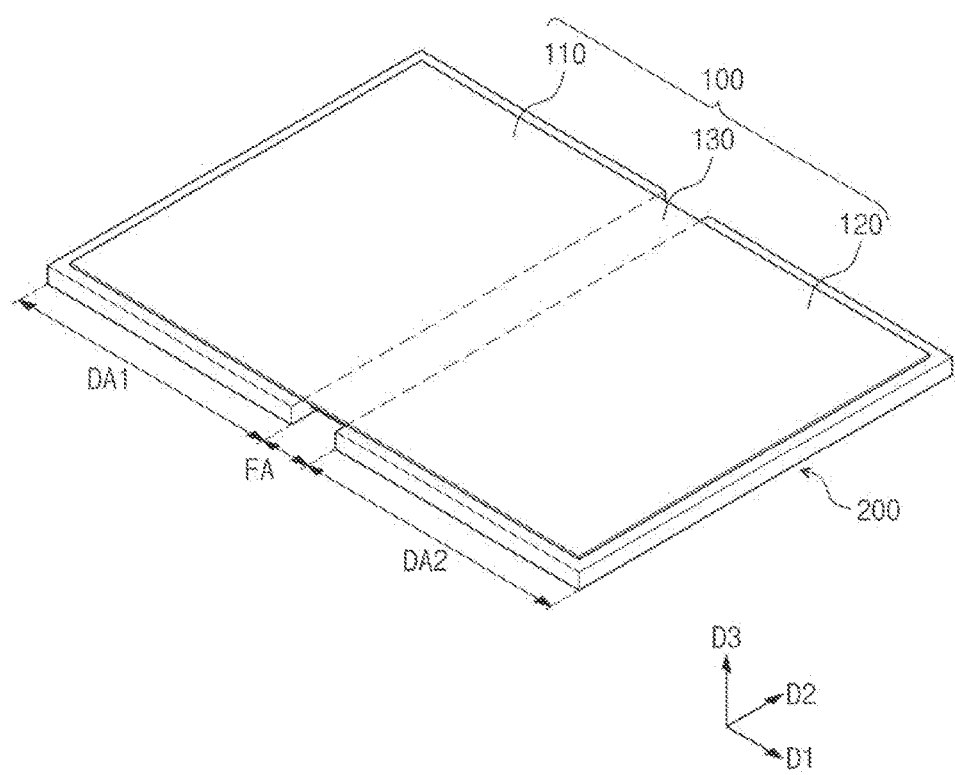
FIG. 5A is a perspective view showing a foldable display according to an exemplary embodiment.
Figure 5B:
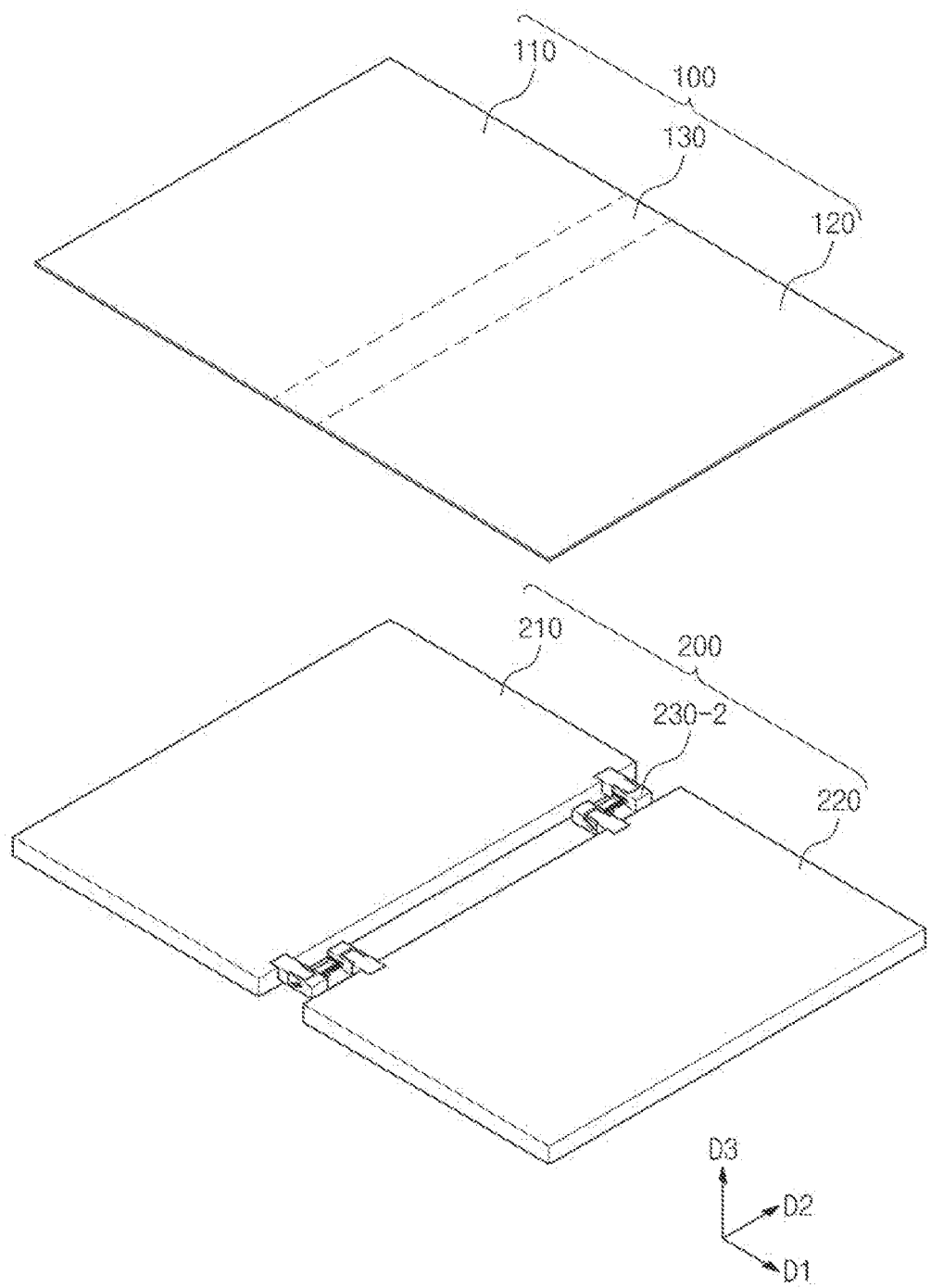
FIG. 5B is an exploded perspective view showing a foldable display according to an exemplary embodiment.
Figure 5C:
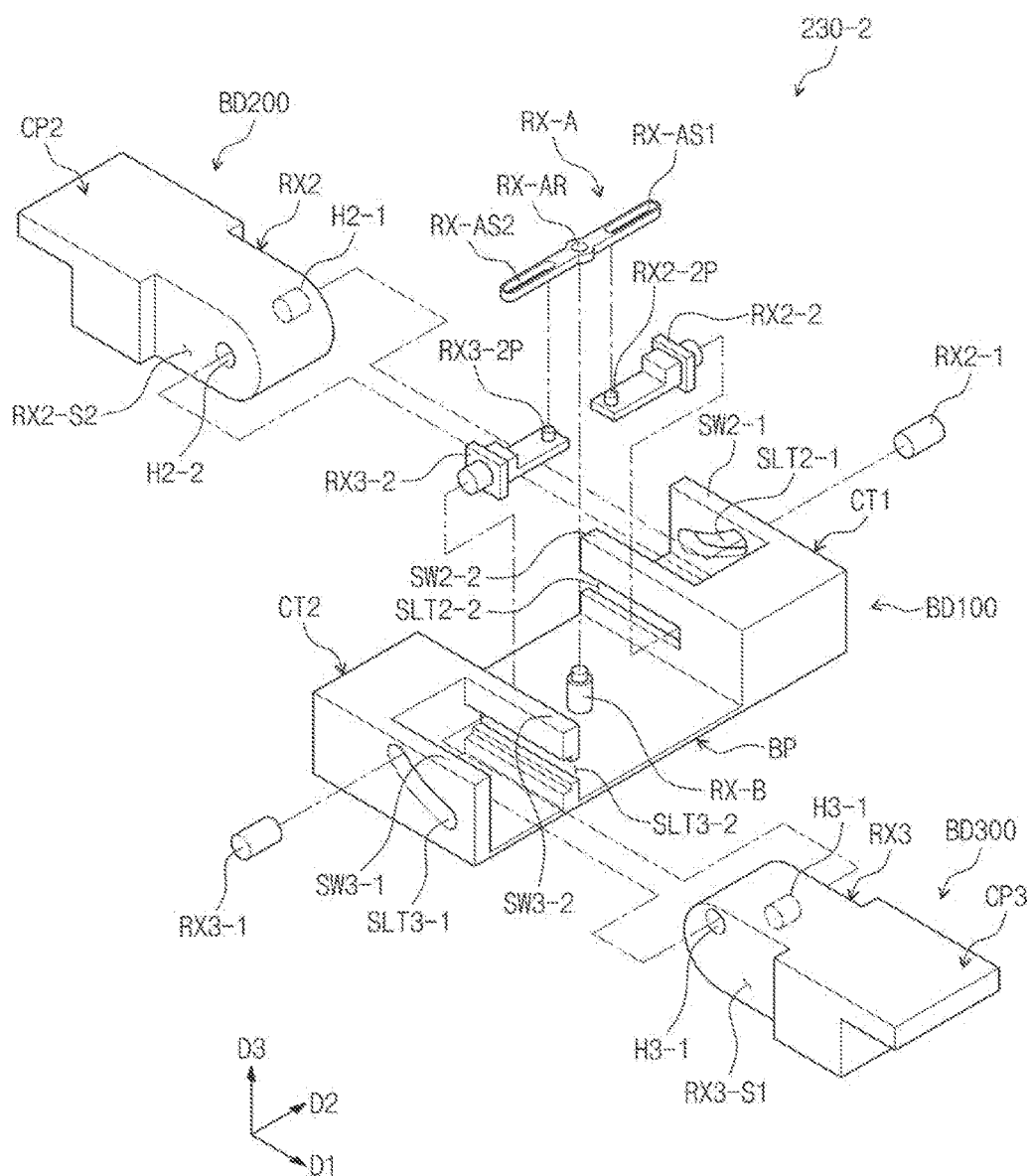
FIG. 5C is an exploded perspective view showing a hinge member according to an exemplary embodiment.
Figure 5D:
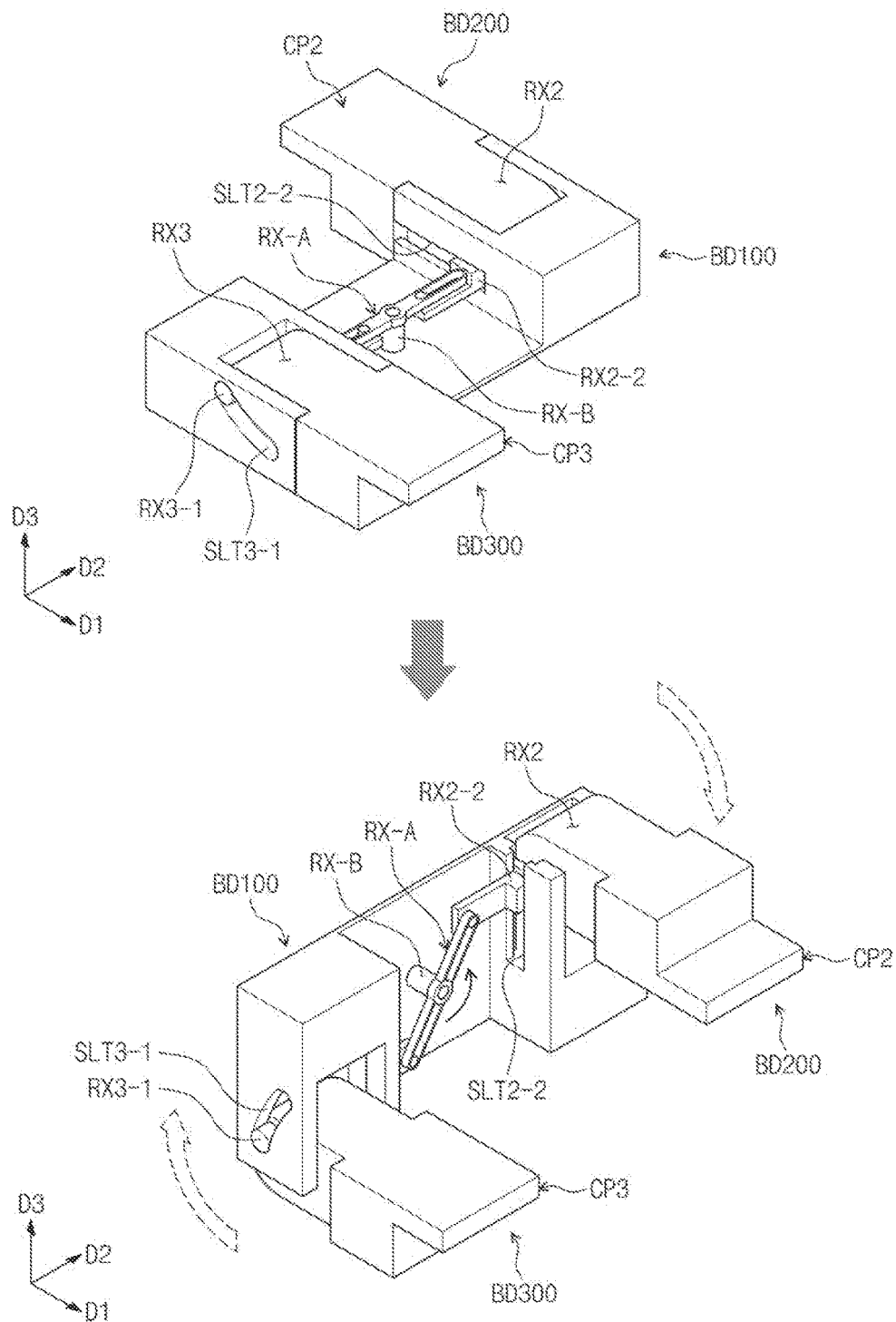
FIG. 5D is a perspective view showing the operation of a hinge member according to an exemplary embodiment.

FIG. 5A is a perspective view showing a foldable display according to an exemplary embodiment. FIG. 5B is an exploded perspective view showing a foldable display according to an exemplary embodiment. FIG. 5C is an exploded perspective view showing a hinge member according to an exemplary embodiment. FIG. 5D is a perspective view showing the operation of a hinge member according to an exemplary embodiment. In FIGS. 5A to 5D, the same reference numerals denote the same elements in FIGS. 3A to 4C, and thus detailed descriptions of the same elements will be omitted.

Referring to FIGS. 5A and 5B, the foldable display includes a flexible display module 100 (hereinafter, referred to as a display module) and a housing 200. In the present exemplary embodiment, the display module includes two display areas 110 and 120 and one folding area 130.

The housing 200 includes a first supporting member 210, a second supporting member 220 arranged to be spaced apart from the first supporting member 210, and a hinge member 230-2 connecting the first and second supporting members 210 and 220. The first and second supporting members 210 and 220 respectively support the display areas 110 and 120 and are respectively connected to the display areas 110 and 120.

FIGS. 5A and 5B show two hinge members 230-2 spaced apart from each other in the second direction DR2.

Referring to FIG. 5C, the hinge member 230-2 includes first, second, and third bodies BD100, BD200, and BD300. Each of the second and third bodies BD200 and BD300 is engaged with the first body BD100 to be rotatable.

The first body BD100 includes a bottom portion BP, a rotation arm RX-A, a first connection portion CT1, and a second connection portion CT2. The bottom BP, the first connection portion CT1, and the second connection portion CT2 can be integrally formed in a single unitary and individual unit or can be separately formed to be connected to each other. A rotation axle RX-B, with which the rotation arm RX-A is engaged, is formed on the bottom portion BP. The first connection portion CT1 and the second connection portion CT2 are arranged on the bottom portion BP and spaced apart from each other in the second direction DR2.

The first connection portion CT1 includes a first guide line SLT2-1 and a first guide slit SLT2-2. The second connection portion CT2 includes a second guide line SLT3-1 and a second guide slit SLT3-2. The first and second guide slits SLT2-2 and SLT3-2 are substantially parallel to each other.

The first guide line SLT2-1 and the second guide line SLT3-1 have a curved line shape. The first guide line SLT2-1 crosses the second guide line SLT3-1, and the first guide line SLT2-1 and the second guide line SLT3-1 have a substantially mirror-inverted shape with respect to the third direction DR3. In FIG. 5C, the first and second guide lines SLT2-1 and SLT3-1 have a slit shape, but they should not be limited to the slit shape. That is, the first and second guide lines SLT2-1 and SLT3-1 have a groove shape.

The first connection portion CT1 includes a first sidewall SW2-1 and a second sidewall SW2-2. The first sidewall SW2-1 is protruded from the bottom portion BP and the first guide line SLT2-1 is defined in the first sidewall SW2-1. The second sidewall SW2-2 is protruded from the bottom portion BP and the first guide slit SLT2-2 is defined in the second sidewall SW2-2. The second connection portion CT2 includes a third sidewall SW3-1 and a fourth sidewall SW3-2. The second guide line SLT3-1 is defined in the third sidewall SW3-1 and the second guide slit SLT3-2 is defined in the fourth sidewall SW3-2. The second and fourth sidewalls SW2-2 and SW3-2 are arranged closer to the rotation axle RX-B than the first and third sidewalls SW2-1 and SW3-1.

The rotation arm RX-A is includes a through-hole RX-AR, into which the rotation axle RX-B is inserted, and third and fourth guide lines RX-AS1 and RX-AS2 defined such that the through-hole RX-AR is interposed between the third and fourth guide lines RX-AS1 and RX-AS2. FIG. 5C shows the third and fourth guide lines RX-AS1 and RX-AS2 having a slit shape. A second axle RX2-2 of the second body BD200 and a second axle RX3-2 of the third body BD300 are respectively engaged with the third and fourth guide lines RX-AS1 and RX-AS2.

The second body BD200 includes a fixing portion CP2, a rotation portion RX2, a first axle RX2-1, and the second axle RX2-2. The fixing portion CP2 is connected to the first supporting member 210. The first axle RX2-1 is engaged with one surface of the rotation portion RX2 and the first guide line SLT2-1. The second axle RX2-2 is engaged with the other surface RX2-S2 of the rotation portion RX2 and the rotation arm RX-A. The second axle RX2-2 is engaged with the third guide line RX-AS1 of the rotation arm RX-A after passing through the first guide slit SLT2-2. The second axle RX2-2 can further include a protrusion RX2-2P engaged with the third guide line RX-AS1 of the rotation arm RX-A.

The third body BD300 includes a fixing portion CP3, a rotation portion RX3, a first axle RX3-1, and the second axle RX3-2. The fixing portion CP3 is connected to the second supporting member 220. The first axle RX3-1 is engaged with one surface RX3-S1 of the rotation portion RX3 and the first guide line SLT3-1. The second axle RX3-2 is engaged with the other surface of the rotation portion RX3 and the rotation arm RX-A. The second axle RX3-2 is engaged with the fourth guide line RX-AS2 of the rotation arm RX-A after passing through the second guide slit SLT3-2. The second axle RX3-2 can further include a protrusion RX3-2P engaged with the fourth guide line RX-AS2 of the rotation arm RX-A.

Referring to FIG. 5D, when the foldable display is in the unfolded state, the rotation arm RX-A is aligned substantially parallel to the second direction DR2. The first and second axles RX2-1 and RX2-2 of the second body BD200 are arranged at one end of each of the first guide line SLT2-1 and the first guide slit SLT2-2. The first and second axles RX3-1 and RX3-2 of the third body BD300 are arranged at one end of each of the second guide line SLT3-1 and the second guide slit SLT3-2. The first axle RX2-1 of the second body BD200 and the first axle RX3-1 of the third body BD300 can be aligned on substantially the same line.

When the foldable display is folded, the rotation arm RX-A is rotated in a counter-clockwise direction. The first and second axles RX2-1 and RX2-2 of the second body BD200 respectively move along the first guide line SLT2-1 and the first guide slit SLT2-2 of the second body BD200. When the rotation portion RX of the second body BD200 is rotated, the first and second axles RX2-1 and RX2-2 of the second body BD200 move to the other ends of the first guide line SLT2-1 and the first guide slit SLT2-2. When the rotation portion RX3 of the third body BD300 is rotated, the first and second axles RX3-1 and RX3-2 of the third body BD300 move to the other ends of the second guide line SLT3-1 and the second guide slit SLT3-2.

When the rotation arm RX-A is rotated in the counter-clockwise direction, the protrusion RX2-2P of the second axle RX2-2 of the second body BD200 and the protrusion RX3-2P of the second axle RX3-2 of the third body BD300 respectively move along the third guide line RX-AS1 and the fourth guide line RX-AS2.

As described above, since the foldable display is folded while the four axles RX2-1, RX2-2, RX3-1, and RX3-2 respectively move along the guide lines SLT2-1 and SLT3-1 and the guide slits SLT2-2 and SLT3-2, the length of the folding area FA in the folded state does not become less than that of the folding area FA in the unfolded state. That is, the folding area FA of the housing 200 (refer to FIGS. 5A and 5B) maintains a substantially constant length.

Although the exemplary embodiments of the inventive technology have been described, it is understood that the invention should not be limited to these exemplary embodiments but various changes and modifications can be made by one ordinary skilled in the art within the spirit and scope of the inventive technology as hereinafter claimed.

What is claimed is:
1. A foldable display, comprising:
   a housing comprising: i) a first support, ii) a second support spaced apart from the first support, and iii) a hinge connecting the first and second supports to each other;
   a flexible display module connected to the first and second supports, wherein the hinge comprises:
      a first body comprising: i) a rotation portion including first and second surfaces opposing each other, ii) a first axle engaged with the first surface of the rotation portion, and iii) a second axle engaged with the second surface of the rotation portion; and
      a second body comprising a connection portion including first and second surfaces opposing each other, wherein a first guide line is defined in the first surface of the connection portion and engaged with the first axle, wherein a second guide line is defined in the second surface of the connection portion and engaged with the second axle, wherein the first guide line is configured to guide the first axle along a substantially straight line parallel to the first surface and the second guide line is configured to guide the second axle along a curved path extending from an upper portion of the second surface to a lower portion of the second surface, and wherein the first and second guide lines at least partially overlap each other in a cross-sectional plane of the axial direction in which the first and second axles extend.
2. The foldable display of claim 1, wherein the second body further comprises a fixing portion connected to the connection portion of the second body and the first support.
3. The foldable display of claim 2, wherein the connection portion of the second body comprises:
   a first sidewall in which the first guide line is defined; and
   a second sidewall in which the second guide line is defined,
   wherein the second sidewall is spaced apart from and opposes the first sidewall.
4. The foldable display of claim 3, wherein the first guide line is a-first slit formed through the first sidewall and the second guide line is a second slit formed through the second sidewall.
5. The foldable display of claim 3, wherein the first body further comprises a fixing portion connected to the rotation portion of the first body the second support.

6. A foldable display comprising:
a housing comprising: i) a first support, ii) a second support spaced apart from the first support, and iii) a hinge connecting the first and second supports to each other;
a flexible display module connected to the first and second supports, wherein the hinge comprises:
a first body comprising: i) a rotation portion including first and second surfaces opposing each other, ii) a first axle engaged with the first surface of the rotation portion, and iii) a second axle engaged with the second surface of the rotation portion;
a second body comprising a connection portion including first and second surfaces opposing each other and, wherein a first guide line is defined in the first surface of the connection portion and engaged with the first axle, wherein a second guide line is defined in the second surface of the connection portion and engaged with the second axle, wherein the second guide line has a curved shape, and wherein the first and second guide lines at least partially overlap each other in a cross-sectional plane of the axial direction in which the first and second axles extend; and
a third body comprising: i) a rotation portion including first and second surfaces opposing each other, ii) a third axle engaged with the first surface of the rotation portion, and iii) a fourth axle engaged with the second surface of the rotation portion, wherein the first body further comprises a connection portion including third and fourth surfaces opposing each other, wherein a third guide line is defined in the third surface of the connection portion and engaged with the third axle, and wherein a fourth guide line is defined in the fourth surface of the connection portion and engaged with the fourth axle.

7. The foldable display of claim 6, wherein the connection portion of the first body comprises:
a third sidewall in which the third guide line is defined; and
a fourth sidewall in which the fourth guide line is defined, wherein the fourth sidewall is spaced apart from and opposes the third sidewall.

8. The foldable display of claim 7, wherein the third guide line is a third slit formed through the third sidewall and the fourth guide line is a fourth slit formed through the fourth sidewall.

9. The foldable display of claim 7, wherein the third body further comprises a fixing portion connected to the rotation portion of the third body and the second supporting member.

10. A foldable display, comprising:
a housing comprising a first support, a second support, spaced apart from the first support, and a hinge connecting the first and second supports to each other; and
a flexible display module connected to the first and second supports,
wherein the hinge comprises:
a first body comprising a rotation portion having first and second surfaces opposing each other, wherein the first body further comprises: i) a first axle engaged with the first surface of the first body, ii) a second axle engaged with the second surface of the first body, iii) a third axle engaged with the first surface of the first body and spaced apart from the first axle, and iv) a fourth axle engaged with the second surface of the first body and spaced apart from the second axle;
a second body comprising a connection portion including: i) a first guide line facing the first surface of the first body and engaged with the first axle and ii) a second guide line facing the second surface of the first body and engaged with the second axle; and
a third body comprising a connection portion including: i) a third guide line facing the first surface of the first body and engaged with the third axle and ii) a fourth guide line facing the second surface of the rotation portion and engaged with the fourth axle,
wherein one of the first and second guide lines has a curved line shape configured to guide the first or second axle, respectively, along a curved path extending from an upper portion of the second surface to a lower portion of the first or second surface, respectively, and one of the third and fourth guide lines has a curved line shape configured to guide the third or fourth axle, respectively, along a curved path extending from an upper portion of the second surface to a lower portion of the first or second surface, respectively, and
wherein the first and second guide lines at least partially overlap each other in a cross-sectional plane of the axial direction in which the first and second axles extend.

11. The foldable display of claim 10, wherein the connection portion of the second body comprises:
a first sidewall in which the first guide line is defined; and
a second sidewall in which the second guide line is defined, and
wherein the connection portion of the third body comprises:
a third sidewall in which the third guide line is defined; and
a fourth sidewall in which the fourth guide line is defined.

12. The foldable display of claim 10, wherein the second body further comprises a first fixing portion connected to the first and second sidewalls and the first support and wherein the third body further comprises a second fixing portion connected to the third and fourth sidewalls and the second support.

13. The foldable display of claim 10, wherein the guide lines that have the curved line shapes have a substantially mirror-inverted shape.

14. The foldable display of claim 10, wherein each of the first, second, third, and fourth guide lines is a slit formed through a corresponding sidewall among the first, second, third, and fourth sidewalls.

15. A foldable display, comprising:
a housing comprising a first support, a second support, spaced apart from the first support, and a hinge connecting the first and second supports to each other; and
a flexible display module connected to the first and second supports,
wherein the hinge comprises:
a first body comprising: i) a bottom portion, ii) a rotation axle formed over the bottom portion, iii) a rotation arm engaged with the rotation axle, iv) a first connection portion including a first guide line having a curved line shape and a first guide slit and v) a second connection portion including a second guide line having the curved line shape and a second guide slit, wherein the first and second connection portions are formed over the bottom portion and are spaced apart from each other;

a second body comprising: i) a first rotation portion including first and second surfaces opposing each other, ii) a first axle engaged with the first surface of the first rotation portion and the first guide line and iii) a second axle engaged with the second surface of the first rotation portion and the rotation arm after passing through the first guide slit; and a third body comprising: i) a second rotation portion including third and fourth surfaces opposing each other, ii) a third axle engaged with the third surface of the second rotation portion and the second guide line and iii) a fourth axle engaged with the fourth surface of the second rotation portion and the rotation arm after passing through the second guide slit.

16. The foldable display of claim 15, wherein the second body further comprises a first fixing portion connected to the first rotation portion and the first support and wherein the third body further comprises a second fixing portion connected to the second rotation portion and the second support.

17. The foldable display of claim 15, wherein the first connection portion comprises a first sidewall in which the first guide line is defined and a second sidewall spaced apart from the first sidewall, in which the first guide slit is defined, wherein the second connection portion comprises a third sidewall in which the second guide line is defined and a fourth sidewall spaced apart from the third sidewall, in which the second guide slit is defined, and wherein the second and fourth sidewalls are arranged closer to the rotation axle than the first and third sidewalls.

18. The foldable display of claim 15, wherein the first guide line crosses the second guide line.

19. The foldable display of claim 18, wherein the first and second guide slits are substantially parallel to each other.

20. The foldable display of claim 15, wherein the rotation arm has i) a though-hole into which the rotation axle is inserted and ii) third and fourth guide lines defined on opposing sides of the through-hole, wherein the second axle further comprises a first protrusion engaged with the third guide line, and wherein the fourth axle further comprises a second protrusion engaged with the fourth guide line.

21. The foldable display of claim 1, wherein the first and second guidelines are inclined with respect to each other.

22. The foldable display of claim 1, wherein the first and second guidelines are formed as through-holes.

23. A foldable display, comprising:

a housing comprising: i) a first support, ii) a second support spaced apart from the first support, and iii) a hinge connecting the first and second supports to each other;

a flexible display module connected to the first and second supports, wherein the hinge comprises:

a first body comprising: i) a rotation portion including first and second surfaces opposing each other, ii) a first axle engaged with the first surface of the rotation portion, and iii) a second axle engaged with the second surface of the rotation portion; and a second body comprising a connection portion including first and second surfaces opposing each other, wherein a first guide line is defined in the first surface of the connection portion and engaged with the first axle, wherein a second guide line is defined in the second surface of the connection portion and engaged with the second axle, wherein the first and second guidelines are inclined with respect to each other, and wherein the first guide line is configured to guide the first axle along a substantially straight line parallel to the first surface and the second guide is configured to guide the second axle along a curved path extending from an upper portion of the second surface to a lower portion of the second surface.

24. The foldable display of claim 1, wherein the first and second guidelines are formed as through-holes.

25. The foldable display of claim 24, wherein each of the through-holes has an elongated shape.

* * * * *